United States Patent [19]

Strecker

[11] Patent Number: 5,380,418
[45] Date of Patent: Jan. 10, 1995

[54] RACK BAR FOR RELEASABLY HOLDING PLATE-SHAPED PARTS

[76] Inventor: Günther Strecker, Lämlinstrasse 40, 7100 Heilbronn, Germany

[21] Appl. No.: 84,243
[22] PCT Filed: Apr. 3, 1992
[86] PCT No.: PCT/DE92/00270
§ 371 Date: Jun. 30, 1993
§ 102(e) Date: Jun. 30, 1993
[87] PCT Pub. No.: WO93/09259
PCT Pub. Date: May 13, 1993

[30] Foreign Application Priority Data

Oct. 30, 1991 [DE] Germany ............... 9113516[]

[51] Int. Cl.6 ............................................. C25D 17/04
[52] U.S. Cl. ................... 204/297 W; 269/903
[58] Field of Search ............ 204/297 W, 297 R, 198; 269/903

[56] References Cited

U.S. PATENT DOCUMENTS 4,752,371 6/1988 Kreisel et al. ............... 204/297 W

FOREIGN PATENT DOCUMENTS 0239736 10/1987 European Pat. Off. .
0254056 1/1988 European Pat. Off. .
3603062 8/1986 Germany .
9017374 3/1991 Germany .

*Primary Examiner*—John Niebling
*Assistant Examiner*—Brendan Mee
*Attorney, Agent, or Firm*—Kenyon & Kenyon

[57] ABSTRACT

In a rack bar (12) for immersion electroplating of printed circuit boards (14) elongated spring clips (34) are provided for clamping the printed circuit boards, which spring clips extend substantially in the direction of the rack bar, are rigidly connected to the rack bar at one of their ends and are movable with their other end contacting the printed circuit board between a clamping position and a disengagement position in which the spring clip is lying as a whole beside the printed circuit board. This arrangement permits an easy frontal loading and unloading of the printed circuit boards, has little wear and allows a great exploitation also of the edge area of the printed circuit board.

20 Claims, 2 Drawing Sheets ced plate being fixed by clamp bolts disposed in the holding blocks. It is considered to be a particular drawback in this arrangement that the plates cannot be loaded and unloaded frontally, i.e. in a direction perpendicular to the plate surface, without moving apart the rack bars supported at the work rail, which is time-consuming and inconvenient, however.

RACK BAR FOR RELEASABLY HOLDING PLATE-SHAPED PARTS

The invention relates to a rack bar for immersion electroplating of plate-shaped parts, in particular printed circuit boards, comprising holding devices at which the plates are held by clamping between a bearing face and a spring clip prestressed in the direction of the bearing face.

BACKGROUND OF THE INVENTION

In a known rack bar of this design the spring clips are movably arranged in bores formed in the rack bar. In their clamping position, the spring clips are aligned substantially at right angles to the longitudinal direction of the rack bar. To load a plate to be coated and unload the coated plate, respectively, the known spring clips are lifted and swivelled aside. Since the spring clips formed as spring wire are rotatably supported in appropriate bores in the rack bar, there is the risk, due to the rotation of the spring clip during loading or unloading, of the coating of the rack bar becoming damaged in the area of the! bearing. Another drawback of the known arrangement is seen in the fact that, because of the alignment of the spring clip in the clamping position substantially perpendicular to the rack bar, the clamping clip protrudes with its clamping end relatively far into the plate to be coated so that the edge area of the plate which cannot be used is relatively large; in practice the width of the not usable plate edge is about 20 mm. Finally the swivelling of the spring clips according to the prior art is comparatively troublesome, because there is a relatively long moving distance of the spring clip and furthermore a rotation of about 90° is necessary.

In another known embodiment of a rack bar each of the holding devices is in integrally formed holding block, and the holding blocks include recesses for inserting the plate to be coated, the plate being fixed by clamp bolts disposed in the holding blocks. It is considered to be a particular drawback in this arrangement that the plates cannot be loaded and unloaded frontally, i.e. in a direction perpendicular to the plate surface, without moving apart the rack bars supported at the work rail, which is time-consuming and inconvenient, however.

SUMMARY OF THE INVENTION

Therefore the problem underlying the invention primarily is to provide an improved rack bar which permits easy frontal loading and unloading of the plates, has little wear and moreover permits a maximum exploitation of the edge area of the plate.

According to the invention, this problem is substantially solved in that the spring clip is formed as an elongated member, and is rigidly fixed to the rack bar or the holding device with one of its ends. The spring clamp extends in the released state on the whole at a shall angle of less than 30°, preferably less than 10° with respect to the longitudinal direction of the rack bar—seen in the plane of the bearing face—and is movable with its free end contacting the plate between a clamping position, in which the plate is clamped between the bearing face and the free end of the spring clip, and a disengagement position in which the whole spring clip lies beside the plate—seen in the plane of the bearing face.

As, in the case of the invention, the spring clip lies completely beside the plate in the disengagement position, a frontal loading and unloading of the plate is ensured. Since the whole spring clip forms an elongated member and extends substantially in parallel to the rack bar or only at a small angle with respect to the latter, the moving distance of the spring clip is very short and moreover substantially linear, which simplifies and accelerates the actuation of the spring clip. Finally as one end of the spring clip is rigidly fixed, the wear occurring in the prior art is avoided, and moreover a released position of the spring clip is defined, which is preferably either the disengagement position or the clamping position of the spring clip. For the other position in which the spring clip is provided in prestress preferably a locking means is provided which, in the simplest case, can be a locking recess or a lateral stop for the clamping end of the spring clip.

Since the long spring clip extends substantially in parallel or tangentially with respect to the plate edge, it can be achieved that the spring clip engages in its clamping position only at the outermost edge of the plate so that a far better exploitation of the plate is possible as compared to the known prior art; the plate edge not usable in the case of the present invention merely amounts to about 5 mm in the specific embodiment compared to 20 mm in the prior art.

In a preferred development of the invention it is provided that plural holding blocks are disposed at a bar in the longitudinal direction at equal distances, the distance between the holding blocks substantially corresponds to the length of the spring clips, and each spring clip is fixed with its rigidly fixed end at a holding block and is supported with its free end at the successive holding block.

In detail, each of the holding blocks preferably comprises an outer portion, which faces away from the bar and includes the bearing face, as well as another portion successive thereto in the direction towards the bar, which corresponds to the disengagement position of the spring clip and can preferably be formed as a locking recess for the spring clip. Then the spring clip has to be moved between the disengagement position and the clamping position merely by a few millimeters, wherein it is held in the clamping position by its prestress and in the disengagement position by the locking recess.

BRIEF DESCRIPTION OF THE DRAWINGS

Further advantageous features of the invention can be seen from the other subclaims as well as from the following description, in which a preferred embodiment of the invention is illustrated in detail with reference to the drawings. They show:

DETAILED DESCRIPTION

Figure 1:
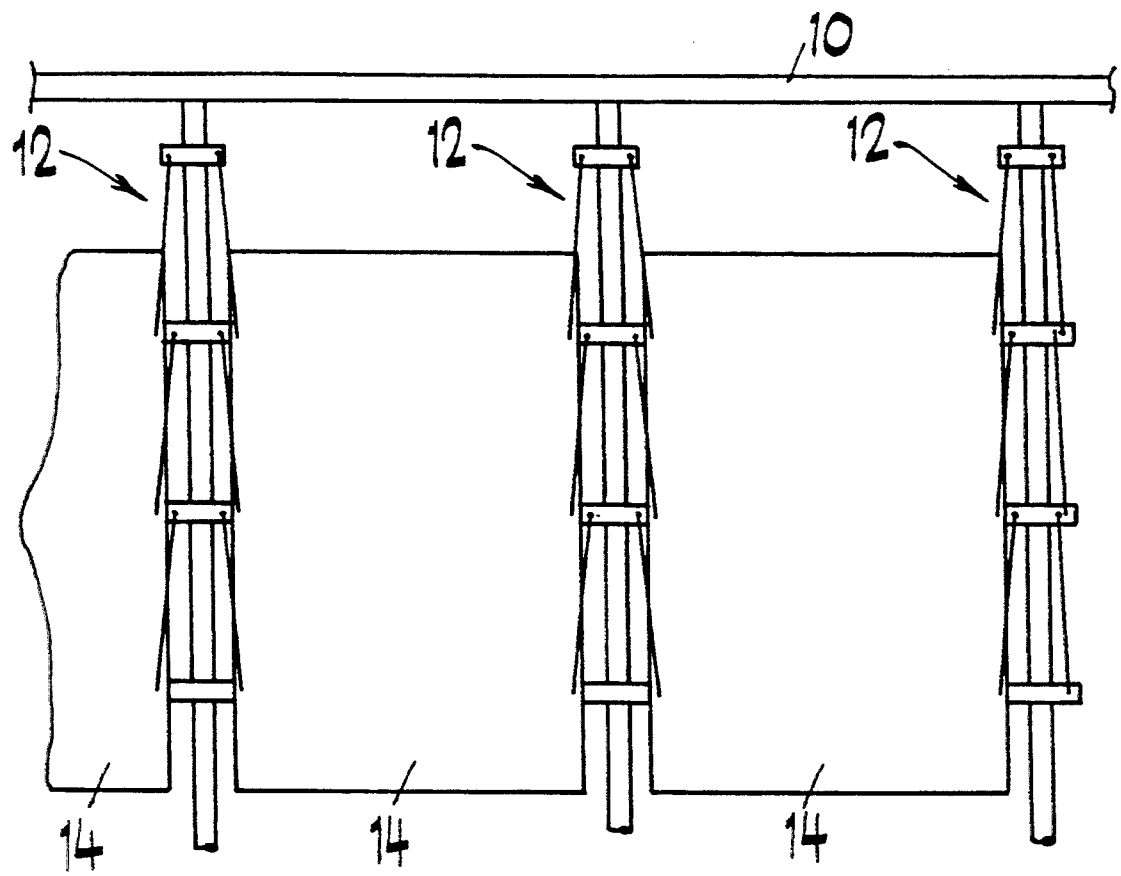
FIG. 1 a diagrammatic partial view of an apparatus for immersion electroplating comprising work support and several rack bars according to the invention fixed thereto, FIG. 2 a magnified detail view of a rack bar according to FIG. 1, FIG. 3 a side view of the rack bar according to FIG. 2 in the direction of the arrow III, and FIG. 4 a section across the rack bar according to FIG. 2 in the direction of the arrows IV—IV.

The apparatus according to FIG. 1 comprises a horizontally disposed support 10, the work rail as it is called, and a plurality vertical rack bars 12 fixed thereto which can be fastened to the work rail 10 detachably or undetachably and possibly also movably in the direction of the work rail 10. Between adjacent rack bars 12 the plates 14 to be coated, for instance printed circuit boards, are detachably held by the holding devices described further below. In the following, reference is made to FIG. 2 to 4 which show the rack bars in greater detail.

The rack bar 12 comprises a bar 16 having a circular cross-section at which plural holding blocks 18 are arranged preferably spaced at equal distances in the longitudinal direction of the bar. In the case of the embodiment, the holding blocks 18 are pushed onto the bar 16 via a throughbore formed therein and are welded thereto. Each holding block 18 is formed symmetrically with respect to the central plane 20 of the bar 16, since the rack bars are formed to support plates 14 at both sides, as is visible from FIG. 1.

Figure 2:
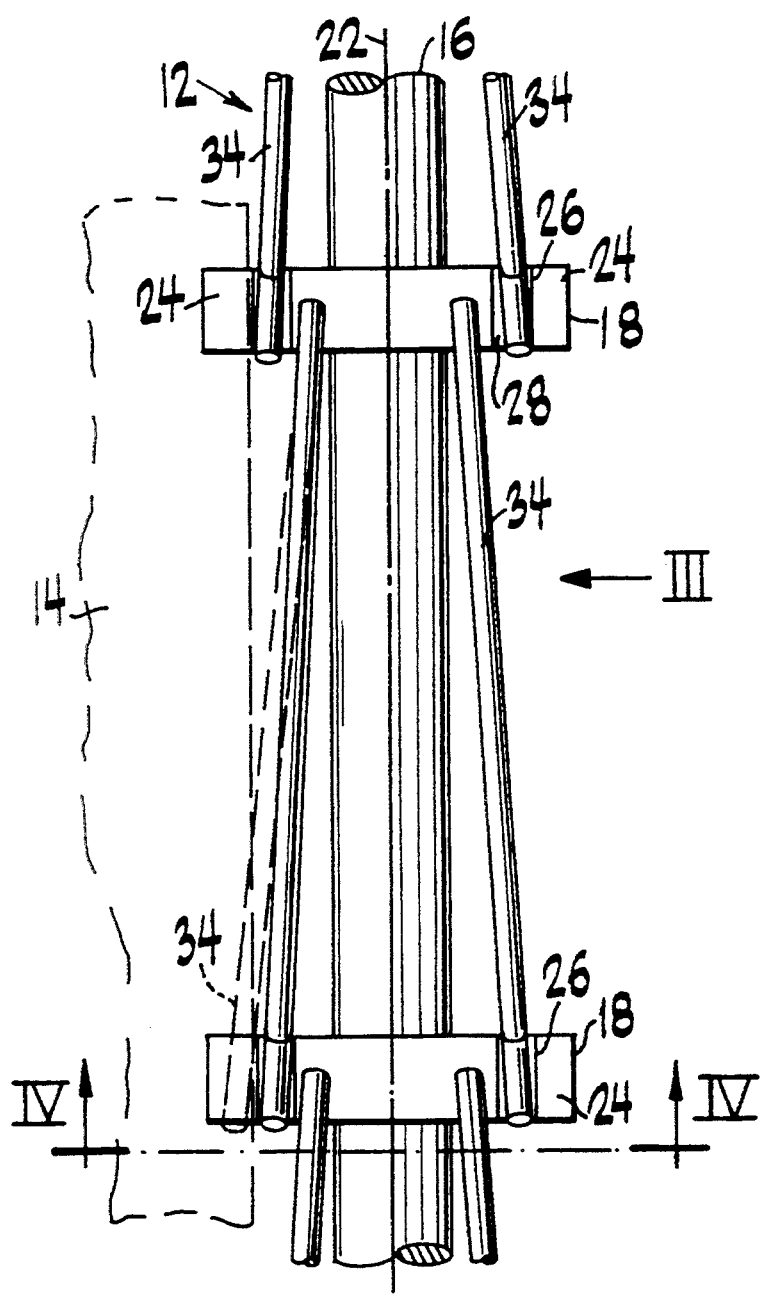
Figure 3:
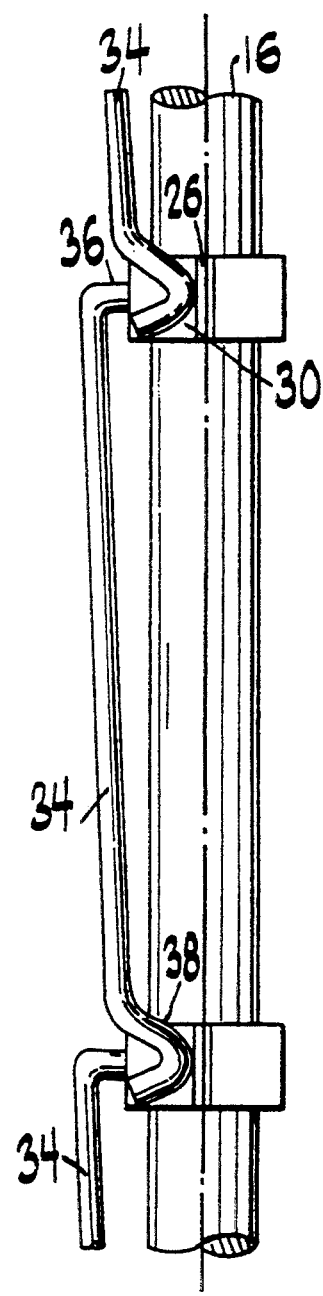

Each holding block 18 includes an outer portion with respect to the longitudinal axis 22 of the bar 16 at which a plane bearing face 24 extending perpendicularly to the central plane 20, namely in the plane of representation according to FIG. 1 or FIG. 2 (plate plane), is formed. The plate 14 fixed to the rack bar is in full surface contact with this bearing face. A stop face 26 extending parallel to the central plane 20 and serving as stop for the plates 14 to be coated follows the bearing face 24 in the direction the longitudinal axis 22.

Figure 4:
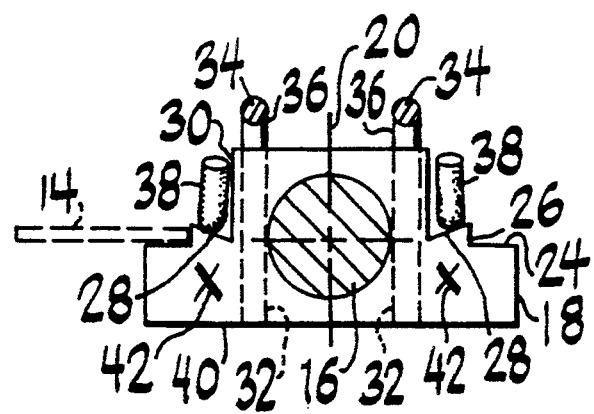

In the direction of the central axis following the stop face 26 an oblique plane 28 is formed which, in the drawing according to FIG. 4, is downwardly inclined in the direction of the central plane 20 and serves, in interaction with the surface 30 arranged in parallel to the stop face 26 and following in the direction of the central plane 20, as a locking recess for the free end of the spring clips described further below.

A throughbore 32 is formed in the holding block 18 between the surface 30 and the bar 16 perpendicularly to the plane of the bearing face 24 and serves for receiving the backward bent leg 36 ,Dr a spring clip completely denoted with 34. The bent leg 36 is welded at its lower end to the lower side 40 of the holding block 18 so that the whole spring clip 34 is rigidly connected to the holding block 18 via the bent leg 36, but it can be swivelled resiliently by a certain degree due to its spring tension.

The spring clip 34 is formed as an elongated member as a whole, which extends substantially in the direction of the longitudinal axis 22 ,Dr the bar 16 or includes only a small angle therewith, as is particularly visible from FIG. 2. The free end of the spring clip 34 opposing the bent leg 36 is formed as nose 38 and contacts the respective next holding block 18 under spring prestress, namely either in the area of the bearing face 24 or in the area of the oblique plane 28. The spring clip is fixed with its bent leg 3,5 in such a position at the respective holding block [8 that, seen in the plane according to FIG. 2, without prestress it lies with its nose 38 in the area of the bearing face 24, as shown by broken lines in FIG. 2. The terms "without prestress" or "released position" are to mean here that the component of the prestress lying in the plane of projection equals zero; of course, perpendicularly thereto there is always provided a prestress. In this clamping position of the spring clip, the nose 38 of the spring clip clamps the plate 14 provided in position between itself and the bearing face 24 due to the prestress of the spring clip acting perpendicularly to the plane of projection according to FIG. 2 and thus holds the plate 14—together with further holding devices—in position. For loading and unloading the plate the spring clip is swivelled by a slight lifting and moving in the direction of the longitudinal axis 22 opposite to the spring force into the disengagement position shown in FIGS. 2 to 4 in which the spring clip remains due to the locking formed there, until it is swivelled into the clamping position again when required.

The above-described embodiment is merely illustrative and is in no way restrictive. Numerous modifications are possible. For instance, the spring clip 34 need not include bent legs, rather the bore in the holding block 18 may also be provided in parallel to the longitudinal axis 22 of the bar ].6, as indicated by the reference numeral 42 in FIG. 4, and particularly in this case the spring clip 34 may also extend in its released position substantially in parallel to the longitudinal axis 22 and define the disengagement position, wherein an appropriate stop or the like has to be provided for the clamping position in this case; for instance, the stop face 26 can be used to this end, if the height thereof is sufficiently bigger than the thickness of the plates 14 to be clamped.

I claim:

1. A rack bar for holding plate-shaped parts for immersion electroplating of the plate-shaped parts, the rack bar having a longitudinal axis and comprising:

holding devices having bearing surfaces thereon on which the plate-shaped parts can be held; and a spring clip comprising an elongated member, said spring clip having one end rigidly secured to the rack bar and an opposite free end biased toward the plane of the bearing surface of one of the holding devices for clamping the plate-shaped part between said free end and said bearing surface, said spring clip having a released position in the plane of the bearing surface wherein said spring clip forms an angle of less than 30° with respect to the longitudinal axis of the rack bar in the plane of the bearing surface, said free end of said spring clip being movable between a clamping position in which the plate-shaped part is clamped between said bearing surface and said free end, and a disengagement position in which said free end is adjacent the plate-shaped part in the plane of said bearing surface.

2. The rack bar of claim 1, wherein said released position comprises either said disengagement position or said clamping position.

3. The rack bar of claim 2, further comprising locking means for securing the spring clip in a position other than the released position.

4. The rack bar of claim 1, wherein said released position of said spring clip comprises said clamping position.

5. The rack bar of claim 1, wherein said spring clip forms an angle of less than 10° with respect to the longitudinal axis of the rack bar in the plane of the bearing surface in the released position.

6. The rack bar of claim 1, further comprising a plurality of spring clips and a bar having a longitudinal axis, and wherein said holding devices comprise a plurality of holding blocks arranged along said bar, said holding blocks spaced at equal distances along the longitudinal axis of said bar, the distance between said holding blocks generally corresponding to the length of the spring clips, and wherein the rigidly secured end if each spring clip is secured to one of said holding blocks and the opposite free end is supported at a successive holding block.

7. The rack bar of claim 6, wherein each of the holding blocks comprises an outer portion extending away from said bar, said outer portion including the bearing surface thereon, said holding blocks each further comprising another portion between said outer portion and said bar corresponding to the disengagement position of the spring clip.

8. The rack bar of claim 7, wherein said another portion comprises a locking recess for the spring clip.

9. The rack bar of claim 7, further comprising a stop for the plate-shaped parts formed between said bearing surface and said another portion.

10. The rack bar of claim 6, wherein said bar includes a central plane there through and wherein said holding blocks are symmetric with respect to said central plane of said bar.

11. A rack bar for holding plate-shaped parts for immersion electroplating of the plate-shaped parts, the rack bar having a longitudinal axis and comprising:

holding devices having bearing surfaces thereon on which the plate-shaped parts can be held; and a spring clip comprising an elongated member, said spring clip having one end rigidly secured to one of said holding devices and an opposite free end biased toward the plane of the bearing surface of another one of said holding devices for clamping the plate-shaped part between said free end and said bearing surface, said spring clip having a released position in the plane of the bearing surface wherein said spring clip forms an angle of less than 30° with respect to the longitudinal axis of the rack bar in the plane of the bearing surface, said free end of said spring clip being movable between a clamping position in which the plate-shaped part is clamped between said bearing surface and said free end, and a disengagement position in which said free end is adjacent the plate-shaped part in the plane of said bearing surface.

12. The rack bar of claim 11, wherein said released position comprises either said disengagement position or said clamping position.

13. The rack bar of claim 12, further comprising locking means for securing the spring clip in a position other than the released position.

14. The rack bar of claim 11, wherein said released position of said spring clip comprises said clamping position.

15. The rack bar of claim 11, wherein said spring clip forms an angle of less than 10° with respect to the longitudinal axis of the rack bar in the plane of the bearing surface in the released position.

16. The rack bar of claim 11 further comprising a plurality of spring clips and a bar having a longitudinal axis, and wherein said holding devices comprise a plurality of holding blocks arranged along said bar, said holding blocks spaced at equal distances along the longitudinal axis of said bar, the distance between said holding blocks generally corresponding to the length of the spring clips and wherein the rigidly secured end of each spring clip is secured to one of said holding blocks and the opposite free end is supported at a successive holding block.

17. The rack bar of claim 16, wherein each of the holding blocks comprises an outer portion extending away from said bar, said outer portion including the bearing surface thereon, said holding blocks each further comprising another portion between said outer portion and said bar corresponding to the disengagement position of the spring clip.

18. The rack bar of claim 17, wherein said another portion comprises a locking recess for the spring clip.

19. The rack bar of claim 17, further comprising a stop for the plate-shaped parts formed between said bearing surface and said another portion.

20. The rack bar of claim 16 wherein said bar includes a central plane there through and wherein said holding blocks are symmetric with respect to said central plane of said bar.

* * * * *

UNITED STATES PATENT AND TRADEMARK OFFICE
CERTIFICATE OF CORRECTION

PATENT NO. : 5,380,418
DATED : Jan. 10, 1995
INVENTOR(S) : STRECKER, Gunther

It is certified that error appears in the above-indentified patent and that said Letters Patent is hereby corrected as shown below:

In column 1, line 17, change "unload" to -- to unload --;

line 24, change "the!" to -- the --;

line 38, change "in" to -- in an --;

line 58, change "clamp" to -- clip --;

line 59, change "shall" to -- small --;

In column 2, line 9, change "Finally" to -- Finally, --;

In column 3, lines 40 and 49, change ", Dr " to -- of --;

line 56, change "3.5" to -- 36 --;

line 57, change "[8" to -- 18 --;

UNITED STATES PATENT AND TRADEMARK OFFICE
CERTIFICATE OF CORRECTION

PATENT NO. : 5,380,418
DATED : Jan. 10, 1995
INVENTOR(S) : STRECKER, Gunther

It is certified that error appears in the above-indentified patent and that said Letters Patent is hereby corrected as shown below:

In column 4, line 14, change "].6," to -- 16, --;

line 67, change "if" to -- of --;

In columns 5 and 6, lines 16 and 38, change "there through" to -- therethrough --.

Signed and Sealed this

Twenty-third Day of January, 1996

Attest:

BRUCE LEHMAN

Attesting Officer    Commissioner of Patents and Trademarks